United States Patent [19]

Römer

[11] 4,155,776
[45] May 22, 1979

[54] ELECTRICAL HEAT SENSING ELEMENT, AND METHOD OF ITS MANUFACTURE, PARTICULARLY FOR GAS BURNING APPLIANCES

[75] Inventor: Kurt Römer, Plochingen, Fed. Rep. of Germany

[73] Assignee: Robert Bosch GmbH, Stuttgart, Fed. Rep. of Germany

[21] Appl. No.: 865,579

[22] Filed: Dec. 29, 1977

[30] Foreign Application Priority Data

Jan. 7, 1977 [DE] Fed. Rep. of Germany ....... 2700380

[51] Int. Cl.$^2$ ............................................. H01L 35/28
[52] U.S. Cl. ..................................... 136/217; 29/573; 72/258; 136/230; 136/232; 136/236 R; 431/80
[58] Field of Search ............................ 72/258; 29/573; 136/217, 230, 232; 431/80

[56] References Cited

U.S. PATENT DOCUMENTS

| | | | |
|---|---|---|---|
| 2,858,350 | 10/1958 | Fritts et al. | 136/217 X |
| 3,332,808 | 7/1967 | Ray | 136/217 X |
| 3,787,958 | 1/1974 | Freedman et al. | 29/573 X |
| 3,808,670 | 5/1974 | Seetoo et al. | 29/573 X |

FOREIGN PATENT DOCUMENTS 1734878 11/1956 Fed. Rep. of Germany.
961146 4/1957 Fed. Rep. of Germany.

*Primary Examiner*—Leland A. Sebastian
*Attorney, Agent, or Firm*—Frishauf, Holtz, Goodman, Woodward

[57] ABSTRACT

The materials forming the inner and outer conductors of the tip of a safety thermoelement are assembled in disk form, stacked above each other, preferably bonded together, for example by soldering, brazing, welding or the like. The disks are then extruded through an extrusion die which shapes the assembly of the disks into a pin or rodlike inner conductor, surrounded by a closed sleeve or cap formed of the outer conductor material. Preferably, the die additionally is shaped to provide an end terminal portion to the inner conductor, offset by a shoulder to permit assembly of the entire unit into a structural holder.

11 Claims, 4 Drawing Figures

ELECTRICAL HEAT SENSING ELEMENT, AND METHOD OF ITS MANUFACTURE, PARTICULARLY FOR GAS BURNING APPLIANCES

The present invention relates to a thermoelement and more particularly to a thermoelement to sense the presence of a gas flame in gas-heated appliances, providing a sensing signal if the gas flame should become extinguished and to a method of its manufacture.

BACKGROUND AND PRIOR ART

It has previously been proposed to make safety thermoelements exposed, for example, to a pilot flame or to a flame from a gas burner by assembling a pin made of constantan-metal with an outer jacket made of a nickel alloy, and then to connect the metals of the resulting junction to a safety circuit cutting off gas flow unless the assembly is exposed to a flame. To make such units, an inner conductor made of a constantan pin is manufactured; an outer conductor made of a nickel alloy is also separately manufactured and the two conductors are then connected by welding at a heat bonding junction. This method is comparatively complex and requires great care to insure that the elements at the heat bonding junction are reliably perfectly electrically connected. Cold extrusion of materials of different metals, and of different characteristics has previously been proposed. For example, it is known to manufacture center electrodes for automotive spark plugs by jacketing an inner core made of copper, which has good heat conductive charactertistics, with a strong jacket made of nickel, which provides corrosion resistance.

THE INVENTION

It is an object of the present invention to simplify the manufacture of thermosensing elements and particularly of elements adapted for exposure to a gas flame.

Briefly, the material of the inner conductor and of the outer conductor are prepared in sheet form, for example in the form of disks, which are stacked above each other and then extruded in an extrusion press. During extrusion, the material forming the outer conductor will shape itself into a unitary closed sleeve or cap, entirely and tightly surrounding the inner conductor. The thickness of the material of the inner conductor preferably is selected to be greater than that of the material to form the outer conductor, so that an elongated connection terminal can additionally be extruded during the extrusion step. Preferably, the disk or sheet-elements of the materials are bonded together before extrusion, for example by soldering or welding.

The present invention is based on the discover that the cold extrusion process can also be used with the type of metals used in thermoelements e.g. constantan and a nickel alloy, and thus is suitable for the manufacture of thermoelements for use, for example, in gas ranges, ovens, gas heaters, or the like.

The method in accordance with the present invention has the advantage that the pin, or rodlike inner conductor and the sleeve or cap-like outer conductor surrounding the head or end portion of the thermoelement can be extruded if that is, shaped and simultaneously electrically connected in one step from shop assemblies which can be readily made. The method is particularly adapted for mass production.

DRAWINGS ILLUSTRATING AN EXAMPLE

Figure 1:
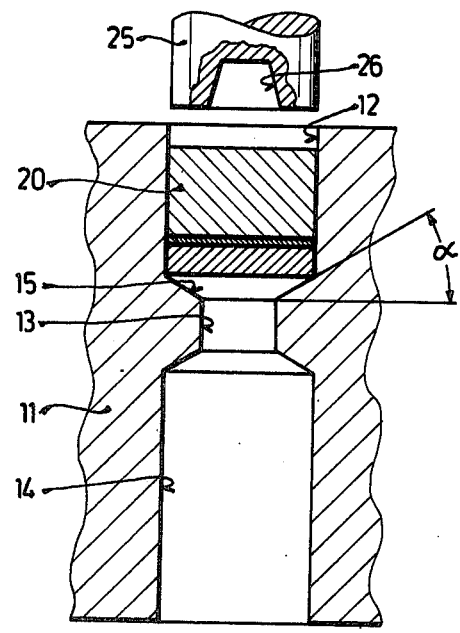
FIG. 1 is a schematic longitudinal cross section through an extrusion press with the prepared raw materials inserted therein.

The thermoelement itself (see FIG. 3) has an inner conductor 32 with a head portion 33, a connecting end portion 28 and an intermediate seating shoulder 27. The head portion 33 is entirely surrounded by a jacket 31 made of the outer conductor material. For example, the inner conductor 32 is constantan, the outer conductor and nickel alloy, the materials being well known for this purpose.

Figure 4:
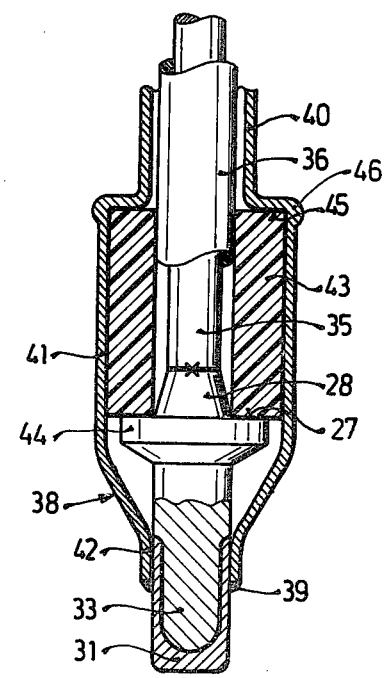
FIG. 4 is a longitudinal cross sectional view of the entire thermoelement structure having the sensing element made in accordance with the method as sequentially illustrated in FIGS. 1 and 3.

The connecting end portion 28 of the inner conductor 32 (FIG. 4) is electrically connected, for example by soldering, to an inner conductor 35. Conductor 35 is surrounded by an insulating sleeve 36. The outer conductor 31 is electrically connected to a housing sleeve 38, for example by soldering, as shown at 39. The outer housing sleeve 38 merges into, or is integral with a protecting end 40 which surrounds the insulating sleeve 36, in turn surrounding the center conductor 35. In manufacture, the housing sleeve 38 is drawn into a tube 40 which is then expanded to form the expanded portion 41 having a wider diameter. An insulating bushing 43 is inserted into the widened portion 41, the thermoelement 32 with the conductor 35 and the insulating sleeve 36 attached thereto is pushed through the insulating bushing 43 until a shoulder 44 formed on the inner conductor abuts against the insulating bushing 43. The expanded portion 41 of the tube 40 is then reduced in diameter to fit against and tightly surround the outer conductor at a short tubular portion 42, where it is connected by soldering, as seen at 39, to the outer conductor 31. The inner insulating bushing 43 is internally seated against shoulder 45 formed by the expanded section of the housing tube 40. The outer end of the tube 40 is additionally formed with a ridge or a bead 46 which is used when assembling the entire thermoelement structure into a holder in a gas appliance, by forming a locating abutment.

Figure 2:
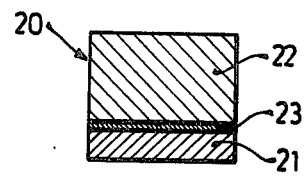
FIG. 2 is a cross sectional view of the prepared raw materials.
Figure 3:
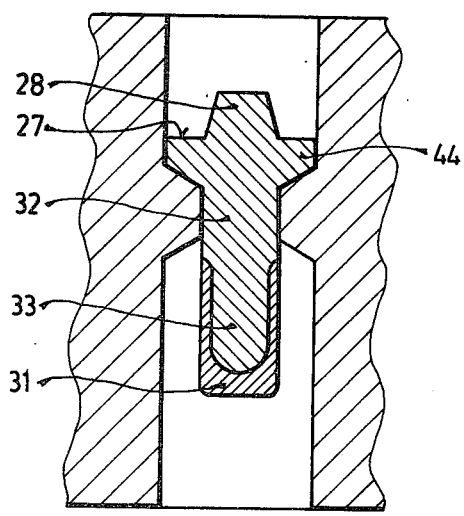
FIG. 3 is a view similar to FIG. 1 and illustrating the thermoelement, after extrusion.

Manufacture of thermoelement head 31, 32, with reference to FIGS. 1 to 3: an extrusion press (FIG. 1) has a die 11 with an extrusion bore 12 therein, passing through a narrowed section 13 which then terminates in a widened portion 14. The transition between the reception opening 12 and the actual extrusion die opening 13 is conical, to form a conical die section 15. A suitable cone angle $\alpha$ with respect to a plane transfers to the die axis is about 30°. The cross section of the openings 12, 13, 14 is circular.

The materials to be extruded are provided in sheet form, preferably in form of circular disks to form a subassembly 20 (FIG. 2). The subassembly 20 includes a strip 21 made of a nickel alloy. It is joined to a disk, made from a strip 22 of constantan metal. A thin metallic intermediate layer 23 can be interposed as a solder; this is not required, however. The diameters of the disks 21, 22 are the same; the axial length of the disk 22 is substantially higher than that of the disk 21, however.

If the intermediate solder layer 23 is used, the two disks 21,22 with the solder layer interposed are heated inductively to liquefaction temperature so that they will solder together. For many applications it is sufficient, however, if the two materials 21,22 are merely placed against each other, without interposition of the solder, and are welded, or bonded, preferably heat bonded together. Also, the disk 21 can be galvanically treated with a copper layer which, during extrusion, provides for intimate connection, and intimate bonding between the elements.

The subassembly formed of disks 21,22, possibly with an interposed solder, or copper layer is introduced into the die of FIG. 1. The die punch element 25 has a recess 26 formed at the end thereof, in frustro-conical form. The die punch is pressed against the die to extrude the assembly of the disks 21,22 through the die opening 13 until it will have the shape as shown in FIG. 3. The recess 26 in the die punch 25 will shape the end terminal portion 28, the flat portion of the die shaping an abutment surface 27 formed on an abutment 44, to permit ready assembly of the sensing head, as explained in connection with FIG. 4. The disk 21 of the nickel alloy material will then have the shape of a closed sleeve, or cap 31, surrounding the head portion 33 of the inner conductor which, likewise, has changed from the essentially disk-like shape as seen at 22 in FIG. 2 to an elongated, round or pin like shape as seen at 32, FIG. 3, the upper portion 33 being securely mechanically and electrically connected to the outer cap or closed sleeve 31.

One of the most common types of thermoelements uses constantan as the inner conductor and a nickel alloy as the outer conductor. The method is also useful with other pairs of metals provided that the particular material lend themselves to pressure, or cold extrusion.

In a suitable enbodiment, to make a thermoelement as a safety sensor for a gas appliance, disk 21 was of nickel alloy with a diameter of 7 mm and axial height of 1.5 mm. Assembled thereto was a disk 22 of constantan with an axial height of 4.5 mm. The diameter of the extruded portion of the element, that is, cap 31 and the adjacent portion of the inner conductor was 3.5 mm.

Various changes and modifications may be made within the scope of the inventive concept.

In the described example the nickel alloy consists of about 90% nickel and 10% chromium. The material for the head portion 33 of the inner conductor 32, known as constantan, is an alloy of 44% nickel, 55% copper and 1% manganese. Instead of using constantan, the head portion 33 may also be made of pure nickel, whilst the jacket 31 may consist of the nickel alloy as described before.

In another preferred embodiment the outer conductor material for the jacket 31 is an alloy of 83% nickel, 16% Chromium and 7% iron. The head portion 33 of the inner conductor 32 is made of constantan.

We claim:

1. Method of making a thermoelectric element, particularly for use exposed to a gas flame, to act as a safety sensor of continuity of the flame having
    an elongated rod, or pin-like inner electrical conductor (33);
    a surrounding or closed sleeve, or cap-like outer conductor (31) totally surrounding the inner conductor at an end portion thereof, said conductors (31,33) being electrically connected and forming a sensing junction therebetween,
    comprising, in accordance with the invention, the steps of
    providing the material of said inner conductor (22) and of said outer conductor (21) in sheet form;
    stacking said conductors, in sheet form, with the material forming the inner conductor (22) being adjacent to the material forming the outer conductor (21);
    and conjointly extruding said conductors with extrusion pressure applied to the material forming the inner conductor (22) through a die (11,12,13,14,15) which forms the sheet material of said conductors into the respective rod, or pin-like shape with the outer conductor surrounding said rod, or pin-like in the conductor in part in the form of a closed sleeve or cap.

2. Method according to claim 1 further comprising the step of bonding said materials, in sheet form, together.

3. Method according to claim 2 wherein said bonding step comprises heat-bonding.

4. Method according to claim 2 wherein said bonding step comprises soldering;
    and the step of providing the materials in sheet form includes the step of providing said materials in disk form.

5. Method according to claim 2 wherein said bonding step comprises welding;
    and the step of providing the materials in sheet form includes the step of providing said materials in disk form.

6. Method according to claim 1 further including the step of copper plating at least one of said materials at the side facing the other of said materials prior to stacking of said conductors in sheet form;
    and said step of providing the materials includes the step of forming said materials into disk-shape.

7. Method according to claim 1 wherein the extrusion step comprises shaping the inner conductor to provide a projecting shoulder (44) thereon, intermediate of the length thereof to provide a terminal tip (28) at the side of the shoulder remote from the end thereof surrounded, at least in part, by said sleeve, or cap-like outer conductor (31).

8. Method according to claim 1 wherein the extrusion step of providing a material of said inner conductor (22) comprises providing the inner conductor in disk-form with an axial thickness substantially greater than the axial thickness of said sheet-form material forming the outer conductor, said outer conductor being in disk-form of a diameter similar to the diameter of the material (22) forming the inner conductor.

9. Thermoelement, particularly for use exposed to a gas flame to act as a safety sensor monitoring continuous existence of the flame, comprises
    a pair of dissimilar conductors forming a thermosensing couple,
    one conductor being an elongated rod, or pin-like inner electrical conductor (33),
    the other conductor being a surrounding, unitary closed sleeve, or cap-like outer conductor (31) entirely surrounding the sensing end portion (33) of the inner conductor,
    a pressure-extended interface bond electrically connecting said conductors (31, 33) and forming a sensing junction therebetween;

and connection means (35;38, 39-43) electrically connected to said conductors to permit inclusion of said conductor into an electrical circuit.

10. Elements according to claim 9 wherein the inner electrical conductor is formed with a shoulder (44) intermediate its length, said shoulder being integral with the inner conductor to provide a locating abutment therefor.

11. Elements according to claim 9 wherein said inner conductor (32) is formed with a terminal tip (28) at the side thereof remote from the end at which said outer sleeve, or cap-like conductor is bonded to the inner conductor, part of said connection means (35) being electrically connected to said connecting tip (28).

* * * * *